(12) United States Patent
Clayton et al.

(10) Patent No.: US 6,714,574 B2
(45) Date of Patent: Mar. 30, 2004

(54) MONOLITHICALLY INTEGRATED OPTICALLY-PUMPED EDGE-EMITTING SEMICONDUCTOR LASER

(75) Inventors: Richard D. Clayton, Kanata (CA); Benoit Reid, Orleans (CA)

(73) Assignee: Bookham Technology, PLC, Abingdon (GB)

( * ) Notice: Subject to any disclaimer, the term of this patent is extended or adjusted under 35 U.S.C. 154(b) by 0 days.

(21) Appl. No.: 09/987,785

(22) Filed: Nov. 16, 2001

(65) Prior Publication Data

US 2003/0026312 A1 Feb. 6, 2003

Related U.S. Application Data

(60) Provisional application No. 60/308,573, filed on Jul. 31, 2001.

(51) Int. Cl.[7] .............................. H01S 5/00; H01S 3/091
(52) U.S. Cl. ........................................... 372/50; 372/75
(58) Field of Search ...................... 372/45, 26; 359/326

(56) References Cited

U.S. PATENT DOCUMENTS

| | | | |
|---|---|---|---|
| 4,802,182 A | * 1/1989 | Thornton et al. ............. 372/26 |
| 5,252,839 A | * 10/1993 | Fouquet ........................ 257/13 |
| 5,365,539 A | 11/1994 | Mooradian .................... 372/75 |
| 5,513,204 A | 4/1996 | Jayaraman .................... 372/96 |
| 5,604,628 A | * 2/1997 | Parker et al. ................ 359/344 |
| 5,894,492 A | 4/1999 | Welch et al. .................. 372/50 |
| 5,936,994 A | 8/1999 | Hong et al. ................... 372/96 |
| 6,239,901 B1 | * 5/2001 | Kaneko ........................ 359/326 |
| 6,252,895 B1 | * 6/2001 | Nitta et al. .................... 375/45 |
| 6,331,990 B1 | * 12/2001 | Parker et al. .................. 372/8 |
| 2002/0075935 A1 | * 6/2002 | Clayton ........................ 372/75 |

OTHER PUBLICATIONS

Gadi Eisenstein, Semiconductor Optical Amplifiers, IEEE Circuits and Devices Magazines, Jul. 1989, pp. 25 to 30.

* cited by examiner

*Primary Examiner*—Paul Ip
*Assistant Examiner*—Hung Vy
(74) *Attorney, Agent, or Firm*—Lahive & Cockfield LLP; Anthony A. Laurentano

(57) ABSTRACT

The invention features an edge-emitting semiconductor signal laser having an active region to produce laser light. There is provided a semiconductor pump laser monolithically integrated with the edge-emitting signal laser. The pump laser includes a photon emissive active region to provide photopumping of the active region of the edge-emitting signal laser, thereby providing optical excitation of the active region of the signal laser.

32 Claims, 8 Drawing Sheets

MONOLITHICALLY INTEGRATED OPTICALLY-PUMPED EDGE-EMITTING SEMICONDUCTOR LASER

RELATED APPLICATIONS

This application claims the benefit of U.S. Provisional Application No. 60/308,573, filed Jul. 31, 2001.

FIELD OF THE INVENTION

The present invention relates to optoelectronic devices, and more particularly, to edge-emitting (or stripe) semiconductor lasers.

BACKGROUND OF THE INVENTION

With the advent of fiber optic communication systems has come the demand for high power, highly efficient and highly integrated laser devices. High power semiconductor lasers are increasingly required for telecommunications systems, predominantly as power sources for optical amplifiers, as Continuous Wave (CW) laser sources used with external modulators, and as directly modulated lasers. Deployment costs, system sizes and electrical power requirements all mandate compact, low cost efficient laser sources.

Traditional semiconductor laser devices use direct current injection into a semiconductor junction to achieve population inversion and laser output. Spatial mode structure is typically controlled through the use of narrow nominally linear regions (so-called stripes, ridges, or mesas) with suitable guiding properties to ensure single spatial mode operation. Electrically pumping the active region leads to power dissipation, which is managed through the thermal conductivity of the surrounding materials and the device heatsink. The electrical pumping level must increase as the required optical power output from the laser is increased, and the power dissipation in the active region then increases, increasing the temperature of the active region. The temperature sensitivity of the laser parameters leads to a saturating light vs. current characteristic, whereby the maximum power which can be achieved from the device is the "roll over" power. Various methods are implemented to increase the roll over power of the existing devices: reducing the electrical and the thermal impedance through longer and wider cavities, which in effect reduces the dissipated power density, reducing the temperature increase through improved heatsinking, or reducing the temperature sensitivity by changing the materials from which the device is constructed. There is also an advantage in enlarging the optical mode within the structure, for example to reduce device degradation depending on optical intensity, but this can be at odds with the required electrical injection efficiency.

The above methods are all employed to varying effect, and with varying degrees of difficulty, but a market for yet higher power devices, or devices with more reliable beam quality, or smaller chip size still exists.

An alternative method of achieving high powers with good beam quality is to use electrically pumped diode lasers (generally large area, multi-mode devices) to optically pump a bulk optic laser material(such as Nd:YAG) which is configured for suitable beam quality. Furthermore, the optical pumping of a lasing material using laser diodes is the only viable option since it is impossible to inject current into certain lasing materials such as Nd:YAG. These so-called "brightness converter" systems have the advantage over directly electrically pumped sources that the electrically pumped diode lasers are running at moderate power density and don't need complex mode control, and that there is little power dissipation in the optically pumped laser material. However, brightness converters are not as efficient as the electrically pumped sources due to a double conversion from electrical to optical, then from optical to optical power.

Power dissipation may also be somewhat improved by reducing the electrical resistivity of laser cavity through increased doping of the p-type material, which is generally the predominant contributor to the laser cavity's series resistance. However, increasing the p-doping level causes higher propagation loss, higher power dissipation in the cavity, lower optical output power and lower efficiency.

Accordingly, there is a strong need for a high power, low cost, small, efficient source which can be made with arbitrary output wavelength. Preferably, such a laser device has low power dissipation density and provides for effective delivery of optical power.

SUMMARY OF THE INVENTION

The above problems and other similar shortcomings of the existing semiconductor laser designs are solved by the novel use of monolithic optical pumping of an edge-emitting semiconductor laser. The invention makes use of the remote electrical power dissipation, tolerance to multi-mode behaviour in the pump source, and large optical cavity design independent of electrical injection efficiency issues associated with the optically pumped devices in order to achieve high output power, while providing the single chip semiconductor benefits of small size, high efficiency, and mechanical simplicity, to achieve the required flexibility and low cost over a wide range of output wavelength. The broad area cavity design provides high power pumping while preserving good spatial mode cavity characteristically associated with narrow stripe lasers.

The invention features a monolithically integrated optical source (a pump laser) to pump a second source (an edge-emitting signal laser), thereby allowing to reduce the heating of the active region of the signal laser by generating and removing the heat often produced in operating electrically pumped lasers a distance away from the signal laser active region. Furthermore, the pump laser has a broad area to minimize the dissipated power density and therefore reduce the heating in the pump laser.

The current invention arises from the realization that in most state-of-the art semiconductor lasers, only a fraction of the injected electrical energy is converted into laser light, and the remaining energy is dissipated within the laser structure as heat. As a result, high power laser output is severely limited by the thermal dissipation resulting from carrier flow during electrical excitation. These parasitic thermal effects can be obviated by photopumping the active region of the edge-emitting signal laser thereby minimizing excessive heating typically associated with current injection. The current invention departs from merely increasing the size of the laser device to improve thermal dissipation and instead focuses on optically pumping the active region of the edge emitting signal laser, thereby improving the optical output power of the edge-emitting signal laser without affecting the stability of the overall system.

Maintaining stable single mode operation is difficult to achieve in large area lasers. However, the pump laser proposed need not be a single mode source, as only the signal laser is required to produce single mode output required for efficient coupling to single mode fibers. The signal laser achieves single lateral and transverse mode operation through straightforward cavity design, as the laser does not need the very large cavities required by electrically pumped high power lasers.

According to one aspect of the current invention, optical reflectors are placed at the sides of the laser device in order to create a resonating optical cavity within the laser device.

According to another aspect of the invention, the signal laser may be configured and designed to operate as an optical amplifier by reducing the reflectivity of the optical reflectors to extremely low levels.

According to another aspect of the invention, a transition region is fabricated between the active region of the edge-emitting signal laser and the active region of the pump laser. The transition region serves as a waveguide to channel and deliver pump light generated by the pump laser to the active region of the edge-emitting signal laser.

According to another aspect of the invention, additional semiconductor pump lasers are monolithically integrated with the edge-emitting signal laser to provide further optical pumping of the active region of the edge-emitting signal laser, such that the rate of carrier recombination and power output of the laser device is generally substantially increased.

Another aspect of the present invention provides a method of fabricating an edge-emitting photopumped semiconductor laser comprising the steps of providing a substrate, fabricating thereon a pump laser active region as well as a signal laser active region. The fabrication process also involves forming a first reflective surface and a second reflective on a first and a second side wall of the laser structure, as well as providing means for excitation of the pump laser active region. Similar fabrication steps may be used to build an edge-emitting photopumped semiconductor laser having a plurality of pump lasers. The pump lasers may be arranged in one- or two-dimensional arrays.

Other aspects and features of the present invention will become apparent to those ordinarily skilled in the art upon review of the following description of specific embodiments of the invention in conjunction with the accompanying figures.

DETAILED DESCRIPTION OF THE PREFERRED EMBODIMENTS

Figure 1:
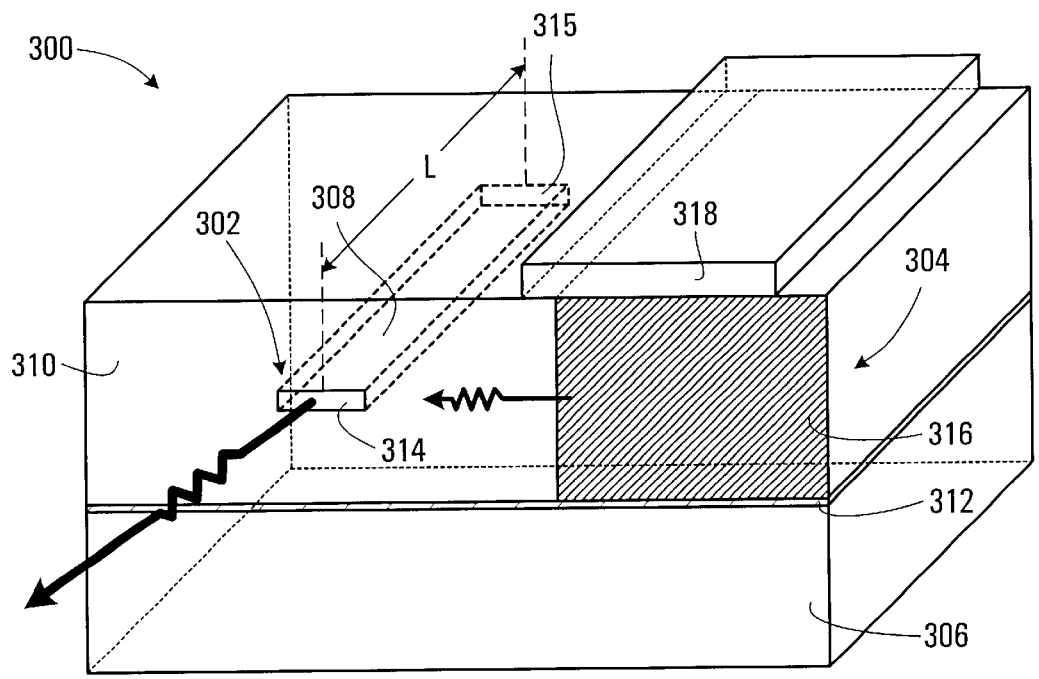
FIG. 1 shows an enlarged schematic diagram of an edge-emitting laser with a monolithically integrated pump laser wherein the active region of the edge-emitting laser is sandwiched between a pair of optical reflectors according to a first embodiment of the current invention.

Exemplary embodiments of the invention are hereafter described with reference to FIGS. 1 to 14. FIG. 1 shows a semiconductor laser device 300 having an edge-emitting signal laser 302 and a pump laser 304 fabricated on a common substrate 306. The substrate 306 typically consists of a heavily doped p-type or n-type InP material which acts as a common foundation for fabricating thereupon the distinctive layers of the signal laser 302 and the pump laser 304. Advantageously, a spacer waveguiding layer 312 comprising an InGaAsP alloy may overlie the substrate 306 to enhance the performance of the laser device 300.

The edge-emitting signal laser 302 includes an active region 308 formed inside a transition region 310. The signal laser active region 308 typically consists of a multiple quantum well of a direct band gap material such as InGaAsP. The alloy composition, doping, layer thickness of the active region 308, as well as the presence of a grating dictate lasing at a specific wavelength. For single-mode lasing to occur, the thickness and the width of the signal laser active region 308 are typically chosen to be on the order of 0.2 $\mu$m and 2 $\mu$m respectively. Since there is no electrical pumping of the signal laser 302, the active region 308 can be undoped so that losses can be made small, which will in turn increase the optical output efficiency.

The pump laser 304 is monolithically integrated with the edge-emitting signal laser 302 and photopumps the laser signal active region 308 along the signal laser active region length L in a direction horizontal to the plane of the substrate 306. The pump laser 304 has a photon emissive active region 316 fabricated on the spacer layer 312. Alternatively, the signal laser active region 308 may be located inside the pump laser active region 316. Similar to the signal laser active region 308, the pump laser active region 316 may consist of the same structure and material as the signal laser 302. Ohmic contact 318 is placed on the top surface of the laser device 300 to cause population inversion in the pump laser active region 316 which in turn causes population inversion in the signal laser active region 308. Alternatively, population inversion may also be achieved in the active region 316 of the pump laser 304 by optically pumping the active region 316.

The pump laser 304 and signal laser 302 are configured and arranged within the monolithic structure to couple pump light from the pump laser 304 to the signal laser active region 308 to allow pumping to above threshold values for laser emission, while allowing enough pump light to propagate within the pump laser active region 316 to maintain continued stimulated pump laser emission. When sufficient pump light is absorbed by the signal laser active region 308, the carriers confined within the active region 308 undergo radiative recombination, causing emission of laser light. Although the ensuing description is based on horizontal pumping of the signal laser active region 308 along its length (L), it is also possible to vertically couple the pump light to the signal laser active region 308, whereby the pump light is coupled to the signal laser active region 308 in a vertical direction with respect to the plane of the substrate 306.

A transition region is provided between the pump active and signal active regions 316, 308 in order to provide sufficient thermal and electrical isolation between these structures.

The transition region 310 is placed on the spacer layer 312 which is shaped and sized to allow fabrication of the signal active region 308 thereupon. The transition region 310 generally consists of InGaAsP or a similar alloy having a larger energy band gap and lower refractive index than the active region 308. As a result, both the carriers generated by optical excitation and the optical power are confined within the active region 308 with its lower energy band gap and correspondingly higher refractive index. Consequently, the heterostructure consisting of the active region 308 and the transition region 310 behaves as an optical waveguide, providing effective channelling of the optical output as well as carrier confinement.

The transition region 310 may also serve as an optical waveguide for efficient routing of the pump light to the active region 308 of the signal laser 302, as well as a barrier against charge diffusion and thermal crosstalk between the signal laser 302 and the pump laser 304. Advantageously, the transition region may be designed such that it exhibits low absorption and scattering losses for the pump light in order to achieve optimal focusing and efficient delivery of pump light to the active region 308.

The optical reflectors 314, 315 are placed on the frontal and rear edges of the signal laser active region 308 in a plane perpendicular to the substrate 306. The optical reflector 314 forms an optical cavity with the optical reflector 315 and has a reflectivity level suitable for feeding a small amount of the propagating radiation back into signal laser active region 308 to maintain oscillating conditions and provoke further stimulated laser emission of signal laser 302. Accordingly, the active region 308, the optical reflector 314 and the optical reflector 315 collectively constitute the signal laser optical cavity for laser light emission. The optical reflectors 314, 315 may be conventional dielectric stack mirrors or curved mirrors or any other type of mirror-like photonic reflectors. It should be noted that the present invention is not limited to a particular optical reflector designs, and other known methods to achieve feedback such as cleaved or etched mirrors or gratings along the length of the laser device 300 may be employed to fabricate a resonating optical cavity structure to cause lasing.

An interesting feature of the current invention is that reducing the reflectivity of the optical reflectors 314, 315 to extremely low levels prevents the occurrence of the oscillating feedback conditions within the signal laser optical cavity, thereby allowing the laser device 300 to operate as an optical amplifier. Accordingly, an optical signal impinging on the active region 308 will provoke stimulated emissions and is consequently amplified as it travels along the signal laser cavity.

To obtain optical amplification, the reduction of the optical reflectors' 314, 315 reflectivity can be achieved by, for instance, depositing a dielectric anti-reflection coating film on the optical reflectors 314, 315, or by tilting the signal laser active region 308 with respect to the optical reflectors 314, 315, or by adding a non-guiding region between the signal laser active region 308 and the optical reflector 314.

The pump light generated by the pump laser 304 has generally (but not necessarily) a shorter wavelength than the signal laser. The wavelength of the pump light may be chosen for optimum offset depending on the application and the choice of fabrication process. Although the laser light produced by the pump laser 304 is not required to be single spatial or spectral mode to cause optical excitation of the signal laser active region 308, variations in the intensity of the pump light directly affect the optical output of the signal laser 302.

Within the above constraints it is possible to construct many different versions of the laser device 300, depending on the specific implementation technology available, the desired laser characteristics, and other design factors such as optimization for highest output power, highest power for a fixed drive current, signal laser noise, signal laser modulation, wavelength stability, power/unit chip volume or area.

To further improve the thermal dissipation, the laser device 300 would generally be mounted on heatsinks with high thermal conductivity (not shown) to remove the excess heat from the laser device 300.

Figure 2:
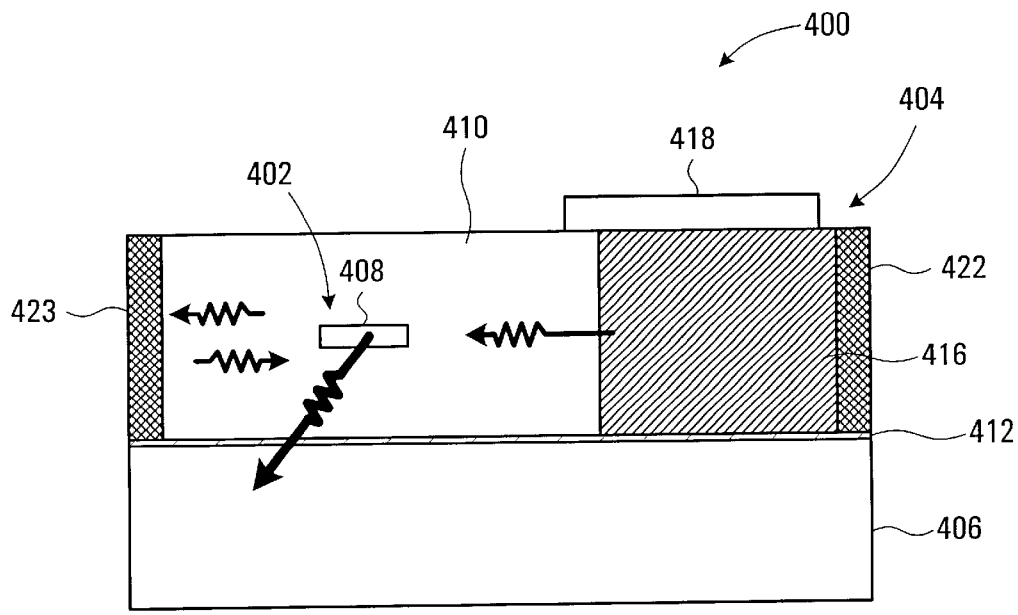
FIG. 2 shows an enlarged schematic diagram of a laser device similar to that of FIG. 1 but with a pair of optical reflectors placed at the sides of the laser structure pursuant to the current invention.

There is shown in FIG. 2 a schematic diagram of a laser device 400 having an edge-emitting signal laser 402 with a pump laser 404 monolithically integrated therewith on a common substrate 406. The laser device 400 is structurally similar to the laser device 300 of FIG. 1, except for a pair of optical reflectors 422, 423 placed at the sides of the laser device 400. For ease of comparison with FIG. 1, corresponding layers of the laser device 400 are denoted by the same numerals as FIG. 1, incremented by 100. An important feature of the laser device 400 is that the laser light generated by the pump laser 404 is oscillating within the optical cavity formed by the pump laser active region 416 and the optical reflectors 423, 422 thereby provoking stimulated emissions within the active region 408 of the signal laser 402. It should be noted that feedback for the pump laser 404 could also be provided by Bragg gratings within the pump laser optical cavity, or by any other method for causing stimulated laser generation therein.

Figure 2A:
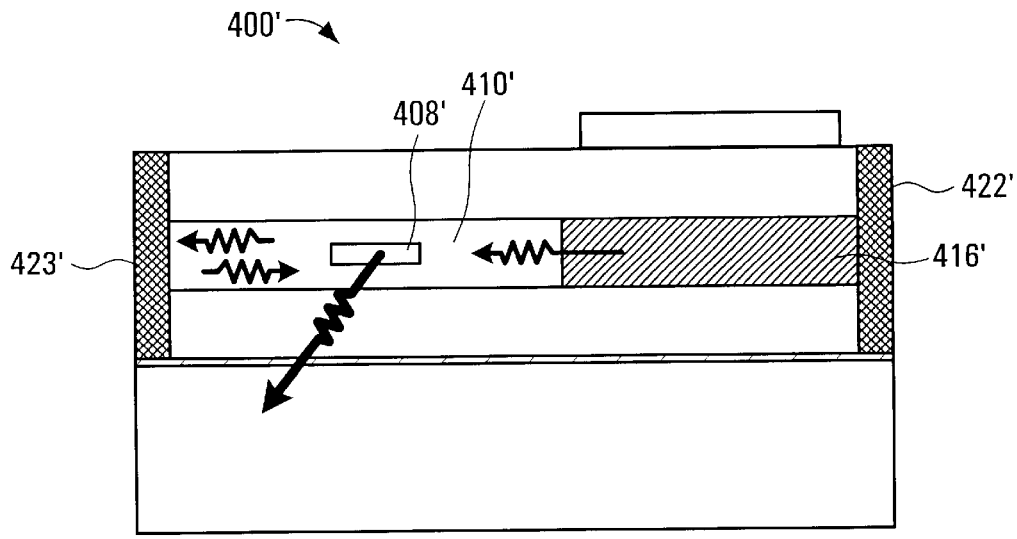
FIG. 2a shows a schematic diagram of the laser device of FIG. 2 wherein the transition region serves as a waveguide for optimally pumping the signal laser.

FIG. 2a illustrates an alternative embodiment of the laser device 400 of FIG. 2 wherein the transition region 410' is fabricated such that it confines and optimizes the delivery of pump light into the signal laser active region 408'. Accordingly, the transition region 410' behaves as a waveguide for effective delivery of the pump light from the pump laser active region 416' into the signal laser active region 408', as well as for directing and recycling the reflected pump light travelling between optical reflectors 422', 423' back into the signal laser active region 408'.

Figure 2B:
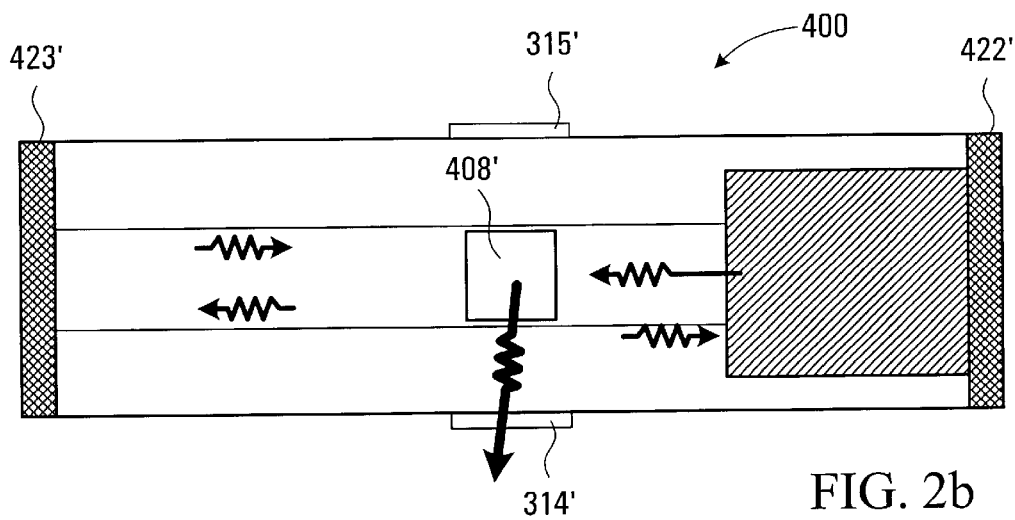
FIG. 2b shows top view of FIG. 2a wherein the optical reflectors are planar.
Figure 2C:
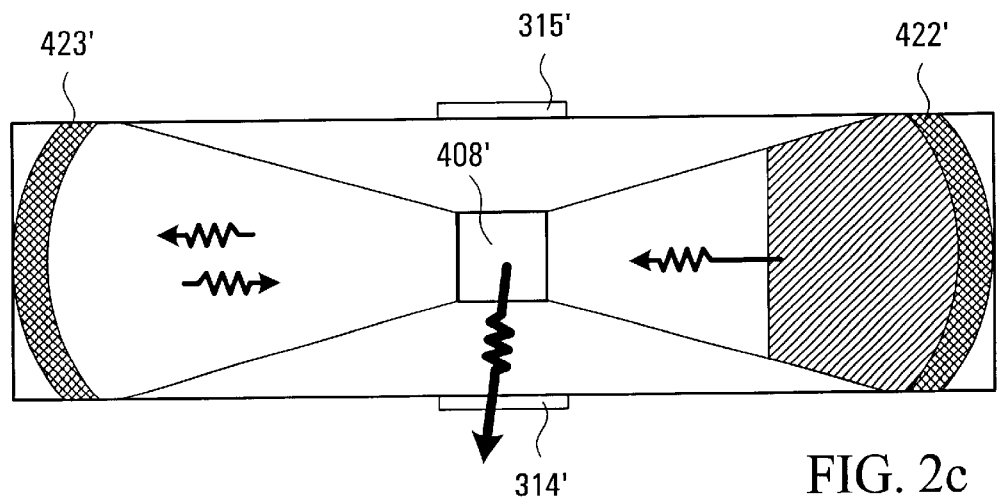
FIG. 2c shows top view of FIG. 2a wherein the optical reflectors are curved.

FIG. 2b shows a top view of FIG. 2a, illustrating the location of the optical reflectors 422', 423', as well as optical reflectors 314', 315'. The optical reflectors 422', 423' may be formed by cleaving the side surfaces of the laser device 400'. Alternatively, Bragg reflectors, dielectric or planar mirrors, curved mirrors or any other type of mirror-like surfaces, may be also be employed. FIG. 2c is a top view of the laser device 400' as depicted in FIG. 2a, with the exception that the optical reflectors 422', 423' are curved mirrors.

Figure 2D:
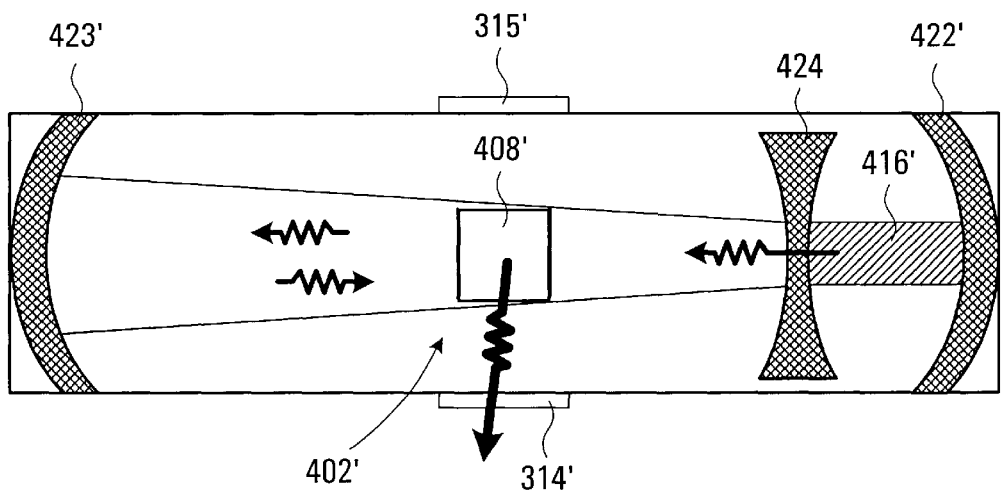
FIG. 2d shows top view of FIG. 2a wherein an optical lens is disposed between the pump laser active region and the signal region active region.

FIG. 2d illustrates a top view of the laser device 400' which is similar in construction to that of FIG. 2c except that, in addition, an optical lens 424 is disposed between the pump laser active region 416' and the signal region active region 408', in order to provide for improved delivery of the pump light to the signal laser 402'.

Figure 3:
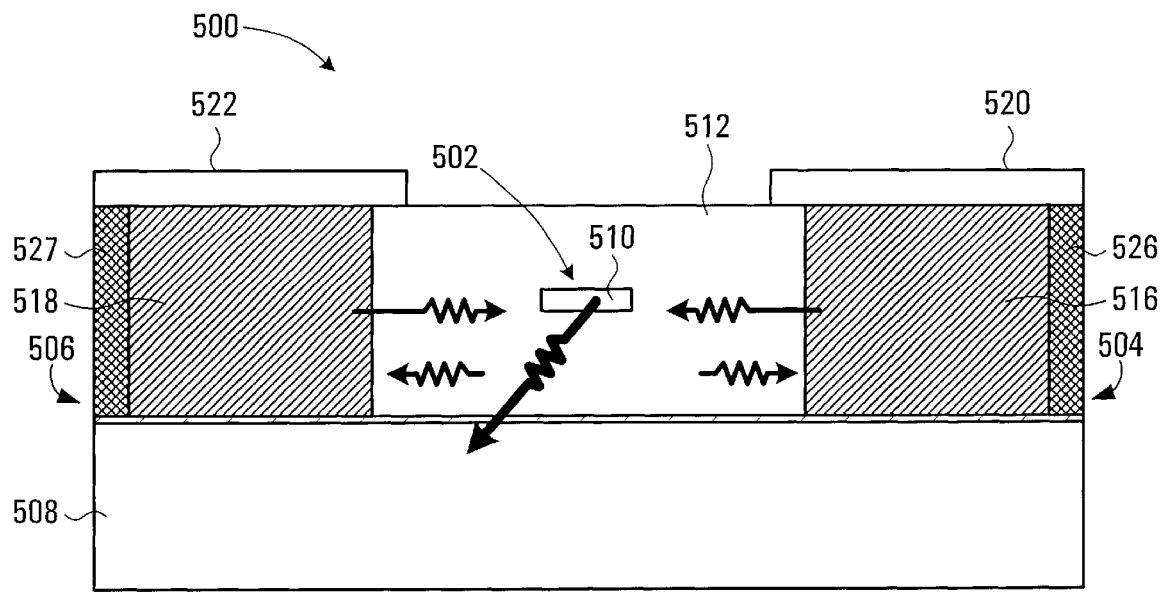
FIG. 3 shows an enlarged schematic diagram of an edge-emitting laser with a pair of monolithically integrated pump lasers according to a second embodiment of the current invention.

Referring now to FIG. 3, a second embodiment of the instant invention is hereinafter described. The laser device 500 includes an edge-emitting signal laser 502 with pump lasers 504, 506 monolithically integrated therein on the same substrate 508. The laser device 500 is structurally identical to the laser device 400 of FIG. 2, except for the introduction of a second pump laser on the other side of the signal laser 402 of FIG. 2 in order to further improve optical pumping of the active region 510.

The pump lasers 504, 506 each include a photon emissive active region 516, 518. The active regions 516, 518 of the pump lasers 504, 506 are designed and configured to cause optical excitation of the active region 510 of the signal laser 502 by horizontally pumping the active region 510. Ohmic contacts 520, 522 are fabricated on top of the pump lasers 504, 506. To cause electrical excitation, current is injected in the pump lasers 504, 506 through ohmic contacts 520, 522. A pair of optical reflectors 526, 527 are incorporated at the edges of the laser device 500 such that both pump regions 516, 518 form a single pump laser cavity, also feeding some of the pump light into the active region 510 of the signal laser 502.

It should be noted that laser device as described above is not limited to a single or double pump laser configuration. Various other configurations, such as a laser array architecture comprising a number of pump lasers for horizontally and vertically pumping the signal laser along the signal laser active region, may also be achieved based on the teaching of the current invention. Moreover, the signal laser may be located inside or outside the pump laser cavities.

FIGS. 4 to 9 schematically illustrate the step by step fabrication process of an exemplary monolithic structure for the laser device according to the teaching of the invention. Fabrication of the laser device 600 involves the following steps:

1) first epitaxial growth on a substrate of the pump and signal laser active regions;
2) etching of the structure to obtain a narrow stripe signal laser heterostructure;
3) second epitaxial growth of overlaying layers to fabricate the pump and signal lasers;
4) completion of the laser device (formation of pump laser mirrors, electrical isolation and ohmic contacts).

It should be noted that although the ensuing fabrication process relates to an n-type substrate, the invention is not restrictively limited to devices having an n-type substrate and similar steps can be performed to fabricate a device on a p-type substrate in accordance with the teaching of the current invention.

Figure 4:
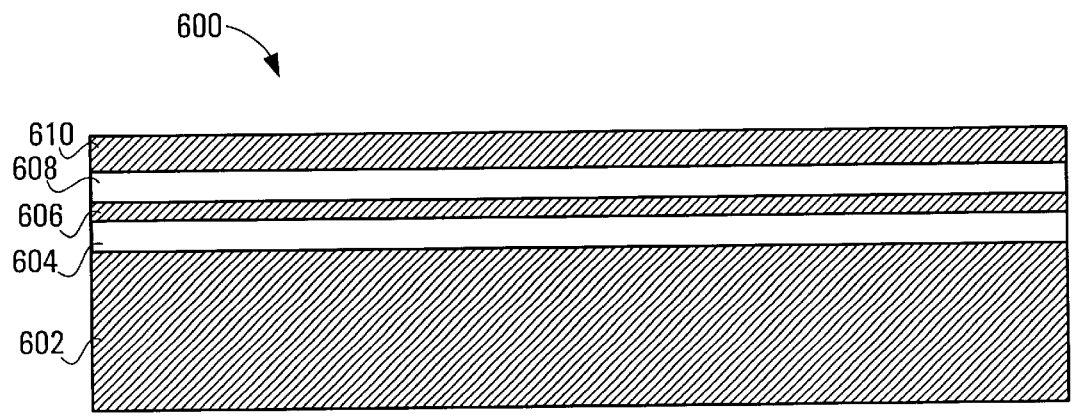
FIGS. 4 to 9 are cross-sectional views illustrating the steps in a fabrication process of an exemplary structure for the edge-emitting laser having a single pump laser.

During the first epitaxial growth step as shown in FIG. 4, a prepared substrate 602 is loaded into a commercially available CVD growth chamber and a pump laser active layer 604, followed by an etch-stop layer 606, a signal laser active layer 608, and cap layer 610 are successively grown thereupon. The substrate 602, etch-stop layer 606 and overgrowth layer 610 are fabricated using n-doped InP, or other characteristically similar Group III-V semiconductor alloys using known crystal growth techniques, for example, metalorganic chemical vapor deposition. The pump laser active region 604 and the signal laser active region 608 typically consist of InGaAsP or similar alloys.

Figure 5:
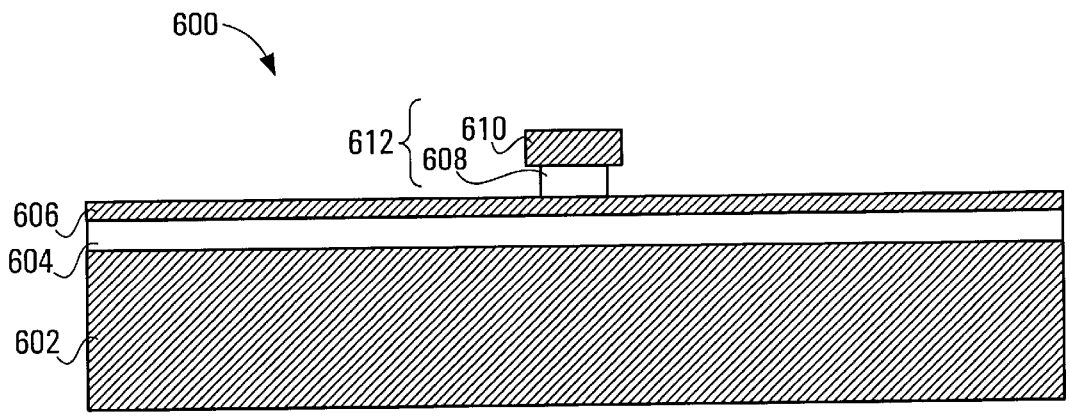

Next, the wafer is removed from the growth chamber and processed so as to form the signal laser mesa structure 612. Using reactive ion etching or wet chemical etching, the signal laser active layer 608 and the cap layer 610 are etched through only to leave the signal laser mesa structure 612 as shown in FIG. 5.

Figure 6:
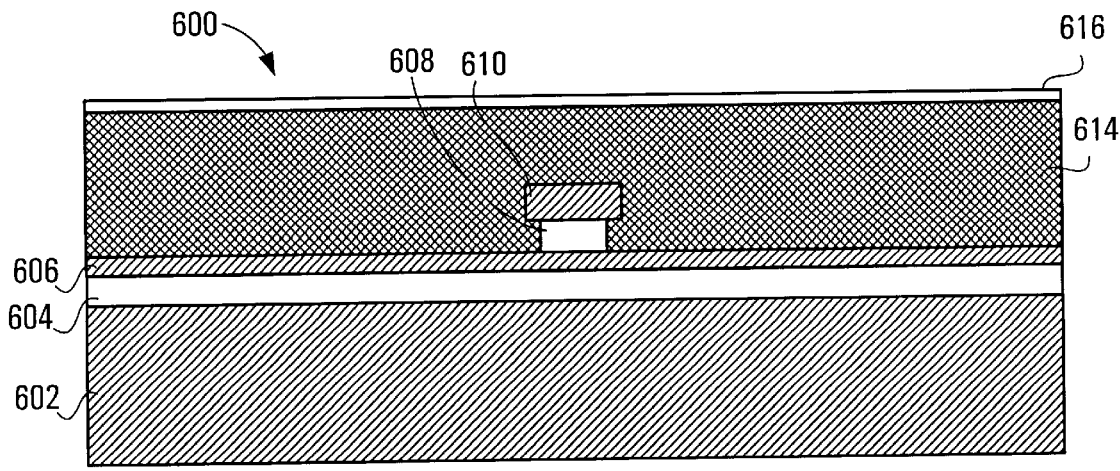
Figure 7:
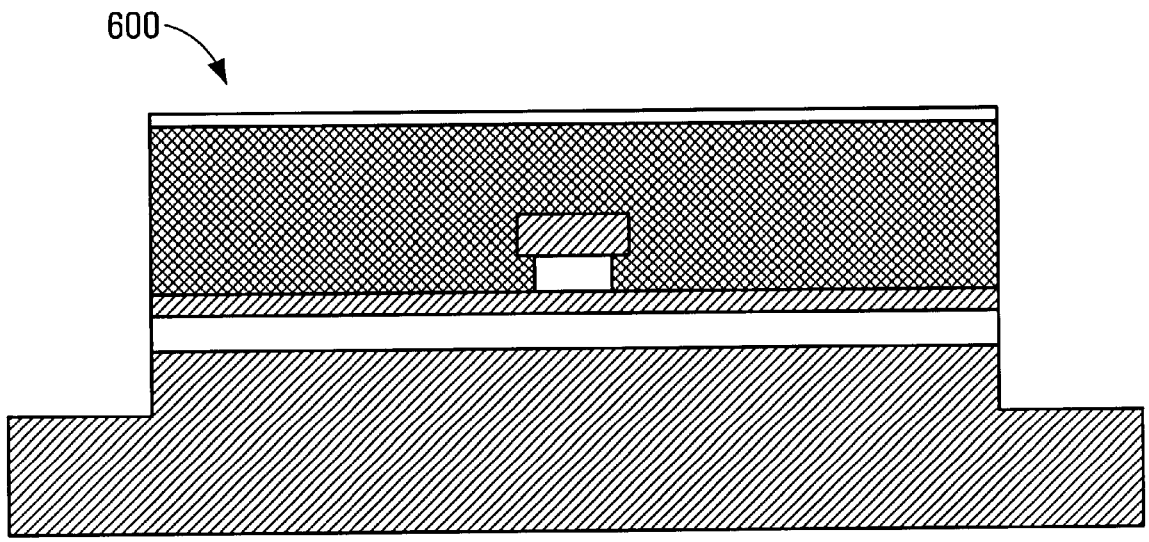
Figure 8:
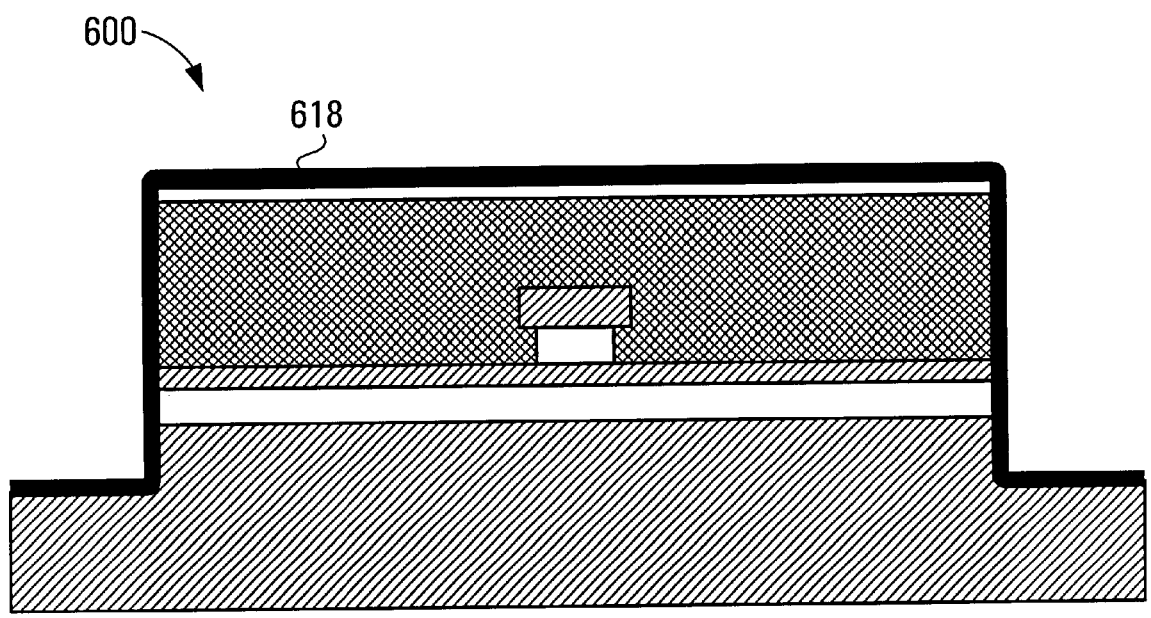

During the second growth step as shown in FIG. 6, a top clad layer 614 of p-type InP is overgrown, followed by a p-type InGaAs contact layer 616. Pump feedback is achieved by mirrors formed by first etching from the contact layer 616 all the way through the substrate 602 on each lateral side of the laser device 600 as illustrated in FIG. 7. To complete the structure, a layer of dielectric 618 such as $SiO_2/\alpha$-Si is subsequently deposited on the surface of the laser device 600, providing reflective facets for the pump laser feedback as depicted in FIG. 8. The dielectric layer 618 may be high reflectivity for efficient feedback of the pump laser light.

Figure 9:
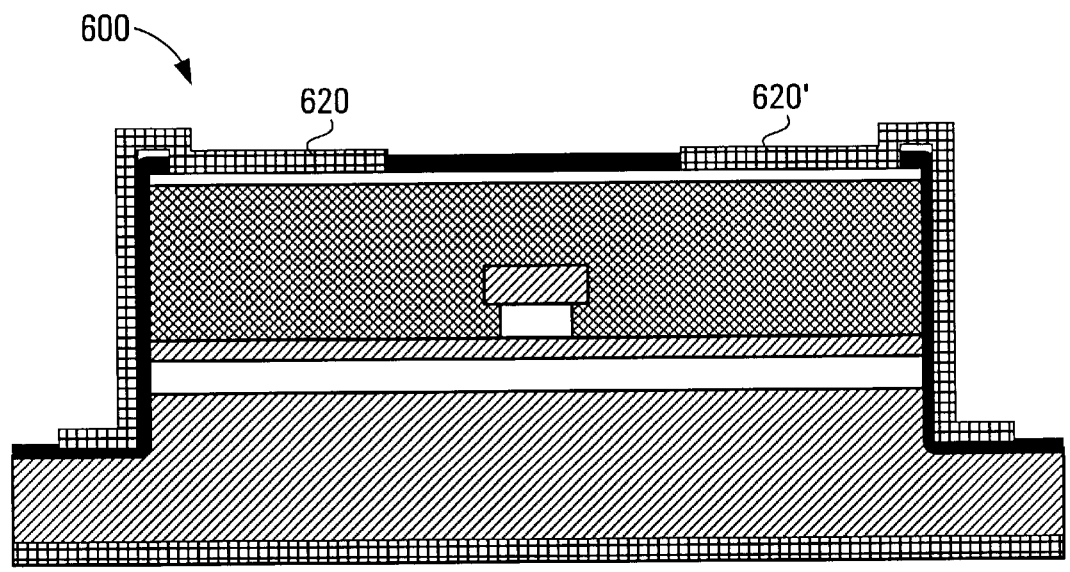

Lastly, FIG. 9 shows the final step of laser fabrication by placing ohmic contacts 620 and 620', and 622 on the top and bottom on the laser device 600 respectively.

Figure 10:
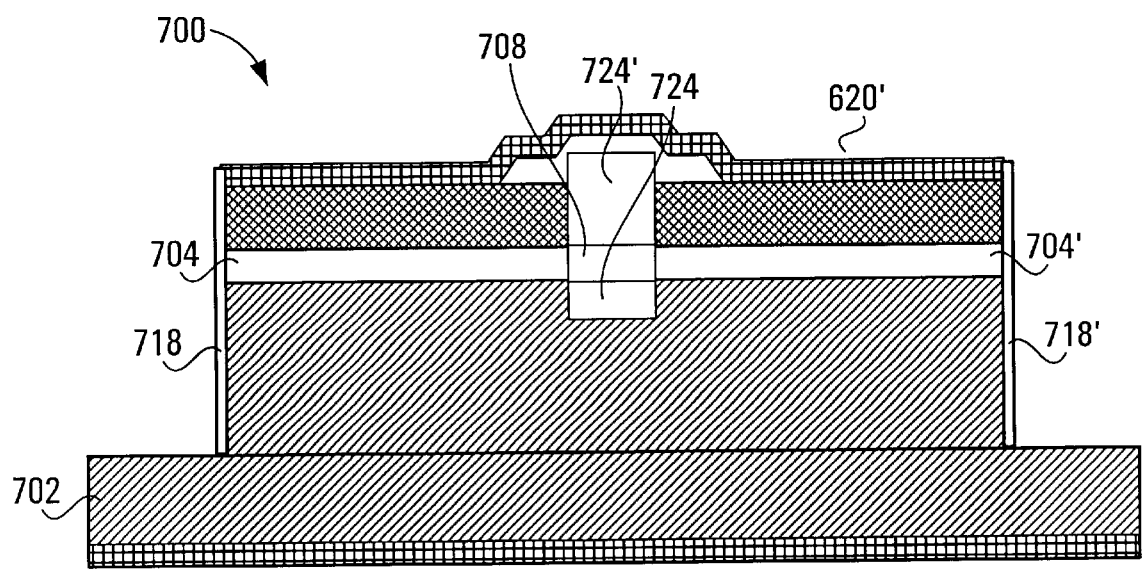
FIGS. 10 to 13 show schematic views of exemplary embodiments of the edge-emitting laser having a single pump laser, the signal laser being located inside the pump laser cavity.

FIGS. 10 to 15 illustrate various exemplary monolithic structures for the laser device according to the current invention. There is shown in FIG. 10 a laser device 700 comprising a substrate 702 on which pump laser active regions 704, 704' are fabricated, having a signal laser active region 708 located therebetween. The pump laser active regions 704 and 704' are substantially aligned such that the pump optical mode has a maximum overlap with the signal laser active region 708.

Optical reflectors 718 and 718' provide a feedback path for the pump light. The signal laser active region 708 may be sandwiched between two layers 724, 724' of intrinsic InP or similar alloys in order to provide optimum confinement of the laser light.

Figure 11:
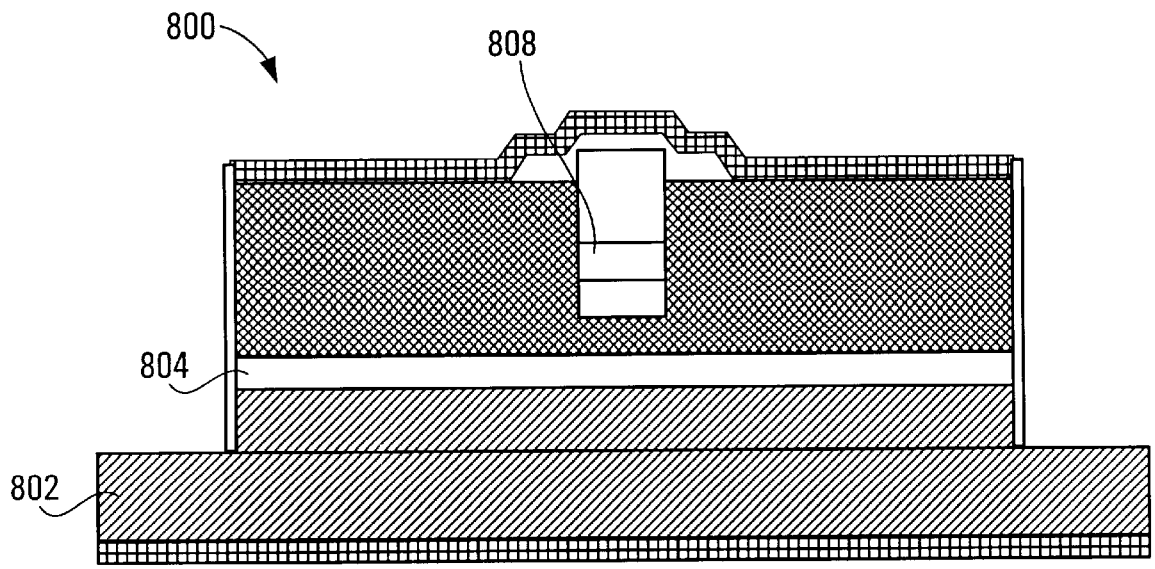

The laser device 800 shown in FIG. 11 is structurally similar to the laser device 700 of FIG. 10, except that the pump laser active region 804 is a uniform layer located below the signal laser active region 808. Accordingly, the signal laser active region 808 is photopumped by the tail of the pump laser optical mode.

Figure 12:
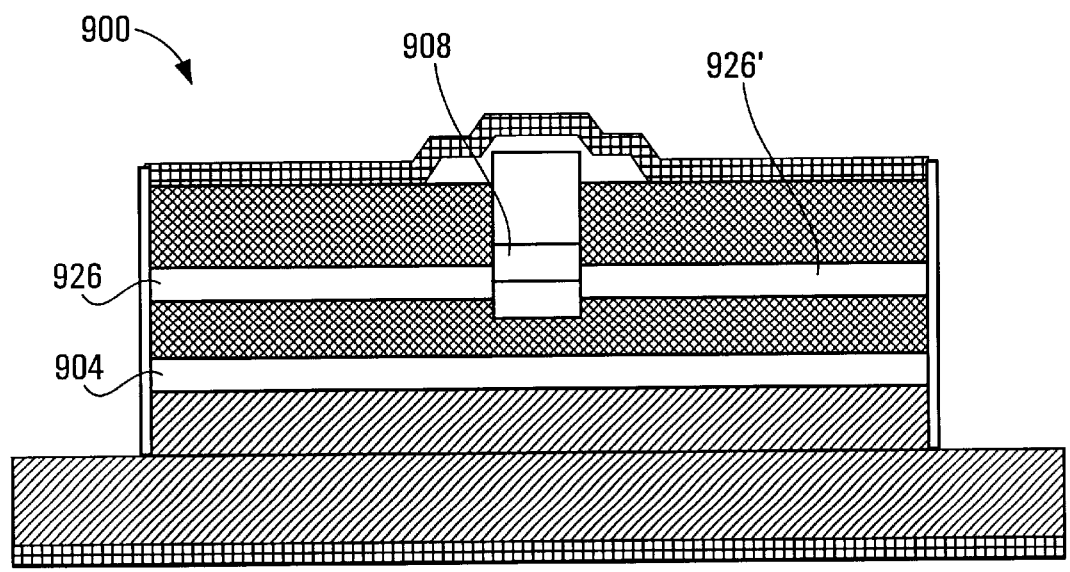

The laser device 900 illustrated in FIG. 12 is also of similar structural design as the laser device 800 of FIG. 11, except for the introduction of quaternary material (Q material) layers 926, 926' substantially aligned with the signal laser active region 908. The Q Material typically consists of InGaAsP or similar alloys having an index of refraction that is higher than the surrounding top clad layer 914. As a result of the difference between the indexes of refraction, Q material layers 926, 926' acts as a waveguide, efficiently channelling the pump light generated by the pump laser active region 904 towards the signal laser active region 908.

Figure 13:
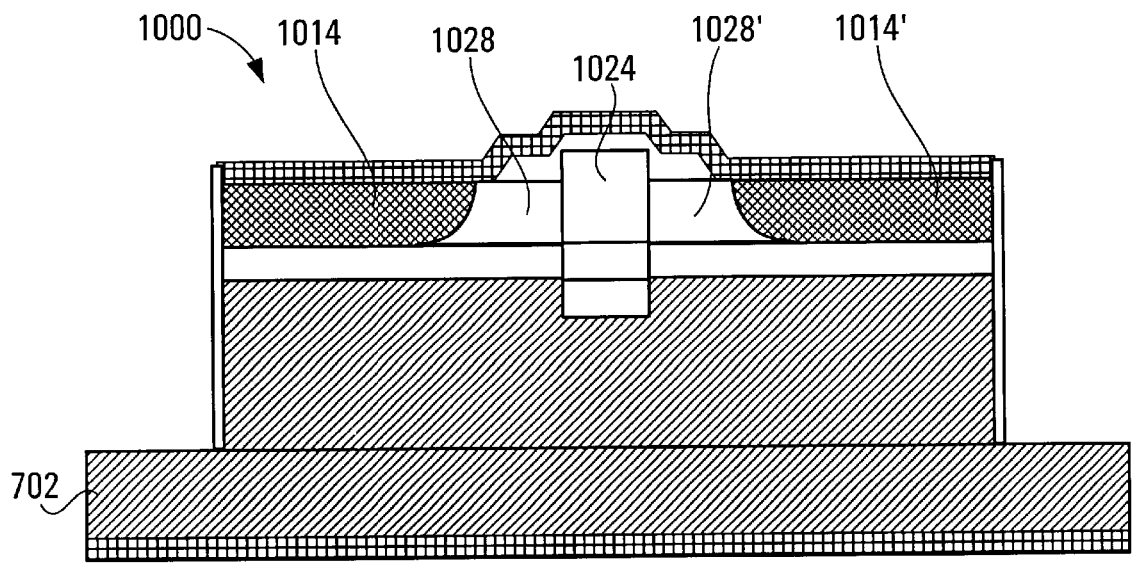

The laser device 1000 shown in FIG. 13 is an improvement over the laser device 700 of FIG. 10. Generally, the p-doped alloy (such as p-InP) employed in top clad layer 1014, 1014' has significant optical losses. It is therefore desirable to reduced p-doping in the top clad layer 1014, 1014' in order to improve the output power of the laser device 1000. However, reduction in p-doping reduces resistance, which in turn escalates the overall heat dissipation of the laser device.

P-doping is usually achieved during the growth step by incorporating Zinc or similar metals in the top clad layer 1014, 1014'. However, Zinc diffusion is erratic and tends to seep out into unwanted areas. In order to improve the optical output power by keeping Zinc out of the signal laser, Zinc diffusion may alternatively take place after the growth step to optimally maintain low Zinc levels in the top clad layer 1028, 1028', and the signal laser active region 1024.

Figure 14:
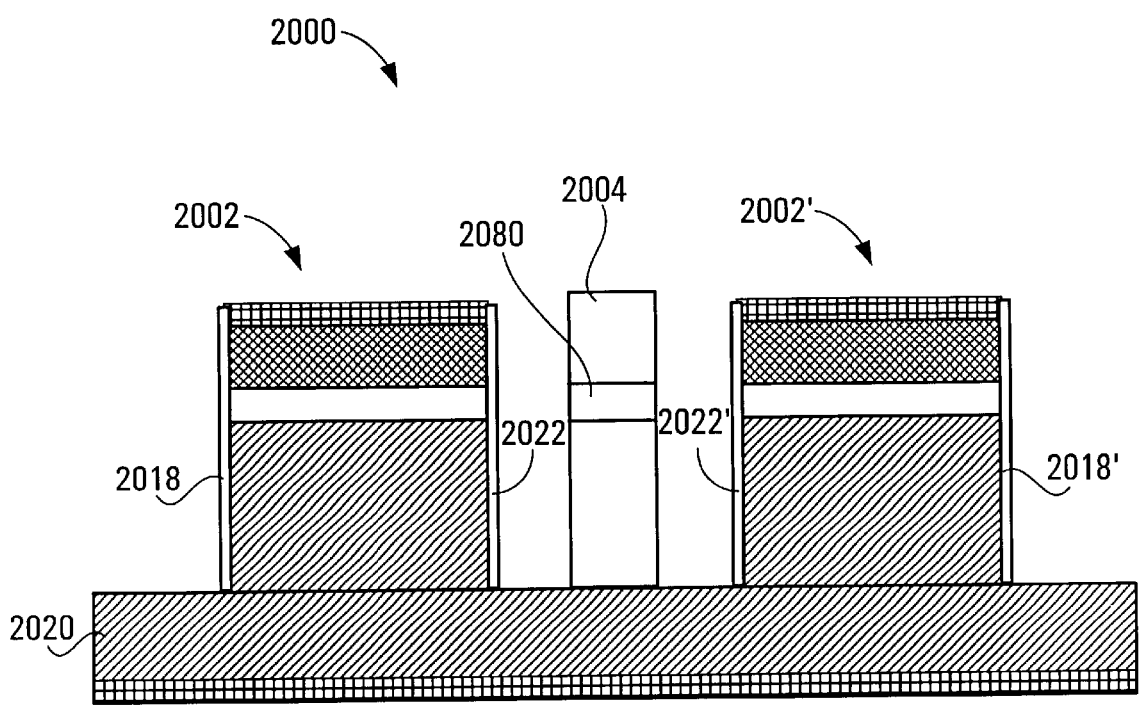
FIG. 14 shows a schematic view of an exemplary embodiment of the edge-emitting laser having a pair of pump lasers, where the signal laser is located outside of the pump laser cavities.

FIG. 14 shows an exemplary embodiment of a laser device 2000 having two pump lasers 2002 and 2002' in spaced relationship with the signal laser 2004, fabricated on a common substrate 2020. The outer mirrors 2018, 2018' are typically high-reflection coated (HR-coated) to prevent light from escaping the laser device 2000. However, the inner etched mirrors 2022, 2022' are typically anti-reflection coated (AR-coated) facets to allow for effective photom-pumping of the signal laser active region 2080.

What has been described is merely illustrative of the application of the principles of the invention. Other arrangements and methods can be implemented by those skilled in the art without departing from the spirit and scope of the present invention.

We claim:

1. An optical device comprising:

a substrate;

a semiconductor edge-emitting signal laser disposed on the substrate for emitting laser light, the edge-emitting signal laser having a signal laser optical cavity comprising an active region at which laser light emission occurs, a cross-section of the signal laser active region being dimensioned to produce a single mode laser light output suitable for efficient coupling to single mode optical fibers: and at least one semiconductor pump laser also disposed on the substrate, the pump laser having a pump laser optical cavity comprising an active region, the pump laser being monolithically integrated with the signal laser such that the pump laser optical cavity lies in a direction substantially perpendicular to that of the signal laser optical cavity and substantially in the same plane as that of the signal laser optical cavity substantially parallel to the substrate, the pump laser providing optical pumping of the signal laser along a signal laser active region length such that laser light output from the signal laser is substantially in the same plane as laser light output from the pump laser and substantially parallel to the substrate.

2. The optical device as set forth in claim 1 wherein the pump laser optically pumps the signal laser in a horizontal direction with respect to the plane of the substrate.

3. The optical device as set forth in claim 1 wherein the pump laser optically pumps the signal laser in a vertical direction with respect to the plane of the substrate.

4. The optical device as set forth in claim 1 wherein the pump laser active region is adjacent to the signal laser active region.

5. The optical device as set forth in claim 1 further comprising a transition region interposed between the signal laser and the pump laser for receiving and guiding pump light therethrough.

6. The optical device as set forth in claim 5 wherein the transition region has a bandgap energy higher than the bandgap energy of the signal laser active region.

7. The optical device as set forth in claim 5 wherein the transition region defines a barrier to reduce non-radiative carrier recombination.

8. The optical device as set forth in claim 5 wherein the transition region defines a barrier to provide for thermal isolation between the signal laser and the pump laser.

9. The optical device as set forth in claim 5 wherein the transition region defines a barrier to reduce charge diffusion.

10. The optical device as set forth in claim 5 wherein the transition region defines a waveguide for effective channelling of the laser light.

11. The optical device as set forth in claim 1 wherein the pump laser is pumped electrically.

12. The optical device as set forth in claim 1 wherein the pump laser is pumped optically.

13. The optical device as set forth in claim 1 comprising a plurality of pump lasers.

14. The optical device as set forth in claim 13, wherein the pump lasers are selected from a group of electrically and optically pumped lasers.

15. The optical device as set forth in claim 1 further comprising a first and a second optical reflector, wherein the signal laser active region, the first, and the second optical reflectors collectively constitute the signal laser optical cavity for laser light emission.

16. The optical device as set forth in claim 15 wherein the first and second optical reflectors are dielectric stack mirrors.

17. The optical device as set forth in claim 15 wherein the first and second optical reflectors are planar mirrors.

18. The optical device as set forth in claim 15 wherein the first and second optical reflectors are formed by cleaved surfaces of a substrate on which the optical device is formed.

19. The optical device as set forth in claim 15 wherein the first and second optical reflectors are Bragg gratings.

20. The optical device as set forth in claim 15 wherein the first and second optical reflectors are curved mirrors.

21. The optical device as set forth in claim 15 wherein the reflectivity of the first and the second optical reflectors is reduced to extremely low levels to prevent laser light feedback within the signal laser active region thereby allowing amplification of an optical signal impinging on the signal laser active region.

22. The optical device as set forth in claim 1 further comprising a third and a fourth optical reflector, wherein the pump laser active region, the third, and the fourth optical reflectors collectively constitute the pump laser optical cavity for pump light emission.

23. The optical device as set forth in claim 22 wherein the third and fourth optical reflectors are dielectric stack mirrors.

24. The optical device as set forth in claim 22 wherein the third and fourth optical reflectors are planar mirrors.

25. The optical device as set forth in claim 22 wherein the third and fourth optical reflectors are formed by cleaved surfaces of a substrate on which the optical device is formed.

26. The optical device as set forth in claim 22 wherein the third and fourth optical reflectors are Bragg gratings.

27. The optical device as set forth in claim 22 wherein the third and fourth optical reflectors are curved mirrors.

28. The optical device as set forth in claim 1 wherein the signal laser active region is disposed outside the pump laser cavity.

29. The optical device as set forth in claim 1 wherein the signal laser active region is disposed inside the pump laser cavity.

30. The optical device as set forth in claim 1 further comprising an optical lens disposed between the pump laser active region and the signal laser active region to provide for improved delivery of pump light to the signal laser cavity.

31. The optical device as set forth in claim 1 wherein the substrate comprises a semiconductor substrate.

32. The optical device as set forth in claim 1 wherein the laser light emission from the signal laser active region of the semiconductor edge-emitting signal laser comprises a single mode emission.

\* \* \* \* \*